United States Patent
Radojcic et al.

(10) Patent No.: US 8,803,305 B2
(45) Date of Patent: Aug. 12, 2014

(54) HYBRID PACKAGE CONSTRUCTION WITH WIRE BOND AND THROUGH SILICON VIAS

(75) Inventors: Ratibor Radojcic, San Diego, CA (US); Arvind Chandrasekaran, San Diego, CA (US); Ryan Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 418 days.

(21) Appl. No.: 12/620,971

(22) Filed: Nov. 18, 2009

(65) Prior Publication Data

US 2011/0115064 A1    May 19, 2011

(51) Int. Cl.
H01L 23/52     (2006.01)
H01L 23/538    (2006.01)
H01L 21/60     (2006.01)

(52) U.S. Cl.
USPC ........... 257/686; 257/776; 257/691; 257/784; 257/E21.509; 257/E23.109; 438/121

(58) Field of Classification Search
USPC .................. 257/686, 776, 691, 784, E21.509, 257/E23.109; 438/121
See application file for complete search history.

(56) References Cited

U.S. PATENT DOCUMENTS

| | | | |
|---|---|---|---|
| 6,020,629 A | 2/2000 | Farnworth | |
| 6,064,113 A | 5/2000 | Kirkman | |
| 6,437,990 B1 | 8/2002 | Degani | |
| 6,800,930 B2 | 10/2004 | Jackson | |
| 7,071,421 B2 | 7/2006 | Heng | |
| 2002/0041027 A1 | 4/2002 | Sugizaki | |
| 2003/0230796 A1 | 12/2003 | Ismail | |
| 2007/0087476 A1* | 4/2007 | Saran | 438/106 |
| 2007/0181991 A1 | 8/2007 | Ishino et al. | |
| 2008/0128884 A1* | 6/2008 | Meyer et al. | 257/686 |

OTHER PUBLICATIONS

Derwent—2002-253073, Jul. 2001, Derwent, Yang.*
International Search Report and Written Opinion—PCT/US2010/057305—ISA/EPO—May 24, 2011.

* cited by examiner

*Primary Examiner* — Long Pham
(74) *Attorney, Agent, or Firm* — Michelle S. Gallardo

(57) ABSTRACT

A hybrid interconnect includes a through silicon via and a wire bond. Hybrid interconnects enable better layout of a stacked IC by combining benefits from both interconnect technologies. In one hybrid interconnect, wire bonds couples a second tier die mounted on a first tier die to a redistribution layer in the first tier die. Through silicon vias in the first tier die are coupled to the wire bonds to provide communication. In another hybrid interconnect, a wire bond couples a redistribution layer on a first tier die to a packaging substrate on which the first tier die is mounted. The redistribution layer couples to a second tier die mounted on the first tier die to provide a power supply to the second tier die. Through silicon vias in the first tier die couple to the second tier die to provide communication from the packaging substrate to the second tier die.

20 Claims, 8 Drawing Sheets

HYBRID PACKAGE CONSTRUCTION WITH WIRE BOND AND THROUGH SILICON VIAS

TECHNICAL FIELD

The present disclosure generally relates to integrated circuits. More specifically, the present disclosure relates to packaging of integrated circuits and stacked integrated circuits.

BACKGROUND

Packaging an integrated circuit (IC) involves sealing the IC in a package suitable for installation in end products and enabling communication between the IC and devices outside of the package. Conventionally, communication in a packaged IC includes either wire bonds or through silicon vias.

A wire bond may be copper, gold, or another conductive material and is coupled to a contact pad on each end. Wire bond interconnects have a low interconnect density resulting from the large size of the contact pad required. The contact pads may be, for example, hundreds of square microns in area, which consumes a large quantity of the IC area. Additionally, during IC packaging a wire bond is enclosed in a bond shell to protect the wire bonds during later assembly. The bond shell further enlarges the size of the packaged IC. However, wire bonds are conventionally less costly to manufacture than through silicon vias.

Through silicon vias are holes through a silicon (or other material) substrate or die. The through silicon vias are filled with a conducting material and function as an interconnect from one side of the substrate or die to another side of the substrate or die. Although conventionally more costly to manufacture than wire bonds, through silicon vias may be manufactured in smaller sizes and higher densities than wire bonds. For example, a through silicon via may be only tens of microns in diameter.

Conventionally, either through silicon vias or wire bonds function as interconnects in a packaged IC. However, stacked ICs present additional challenges for packaging ICs. For example, when a second die is stacked on a first die, both dies must communicate to external devices through the packaging interconnect. The resulting number of interconnects between the first die and a packaging substrate is difficult to manage. For example, a stacked IC may have twice the number of packaging interconnects than in a conventional IC.

Thus, there exists a need for balancing the benefits and costs of wire bonds and through silicon vias in stacked ICs.

BRIEF SUMMARY

According to one aspect of the disclosure, a packaged semiconductor system includes a first tier die having a redistribution layer and through silicon vias. The packaged semiconductor system also includes a second tier die mounted on the first tier die. The packaged semiconductor system further includes a packaging substrate on which the first tier die is mounted. The packaged semiconductor system also includes wire bonds connecting the packaging substrate and the redistribution layer of the first tier die. The wire bonds provide power to the second tier die from the packaging substrate.

According to another aspect of the disclosure, a method of providing power to a stacked IC having a first tier die with a redistribution layer and through silicon vias, the first tier die mounted on a packaging substrate, and a second tier die mounted on the first tier die includes coupling at least one wire bond to the packaging substrate and the redistribution layer. The method also includes providing a power supply to the second tier die through the wire bond(s). The method yet also includes providing communication to the second tier die through the through silicon vias.

According to yet another aspect of the disclosure, a semiconductor system includes a first tier die having a redistribution layer. The semiconductor system also includes a second tier die mounted on the first tier die. The semiconductor system yet also includes wire bonds connecting the second tier die and the redistribution layer.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
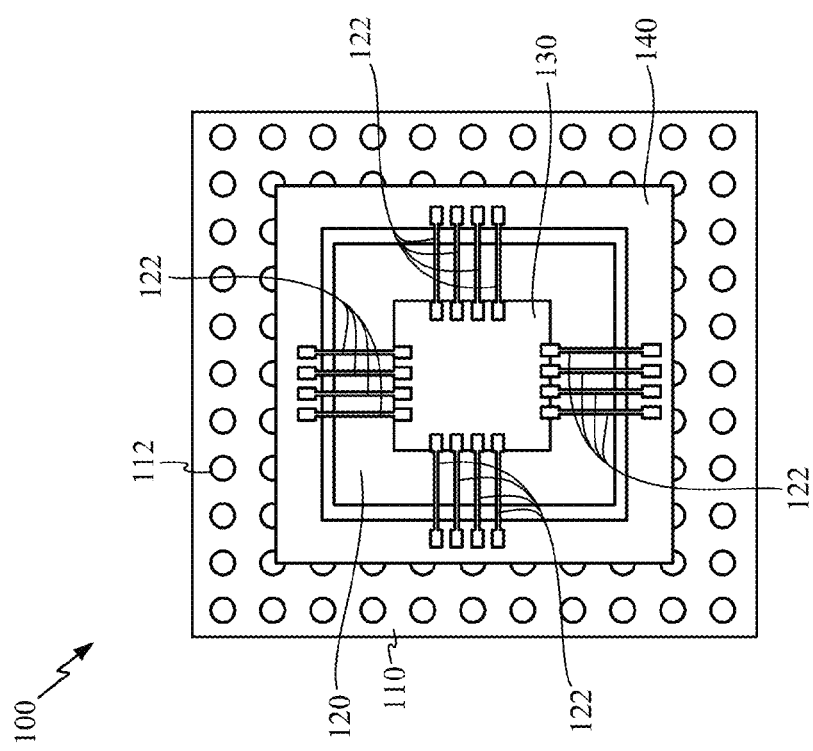
FIG. 1A is a top-down view of a conventional stacked IC having wire bond interconnects.

FIG. 1A is a top-down view of a conventional stacked IC having wire bond interconnects. A conventional stacked IC 100 includes a packaging substrate 110 having a packaging connection 112 such as bumps of a ball grid array (BGA). A first die 120 is coupled to the packaging substrate 110. A second die 130 is stacked on the first die 120. Communication between the second die 130 and the packaging substrate 110 is enabled through wire bonds 122. The wire bonds 122 are enclosed in a bond shell 140 for protection during later semiconductor assembly.

The bond shell 140 encompasses a larger area on the packaging substrate 110 than the first die 120. Thus, the size of the stacked IC 100 is based, in part, on the bond shell 140. Reductions in size of the first die 120 alone may not reduce the size of the stacked IC 100.

Figure 1B:
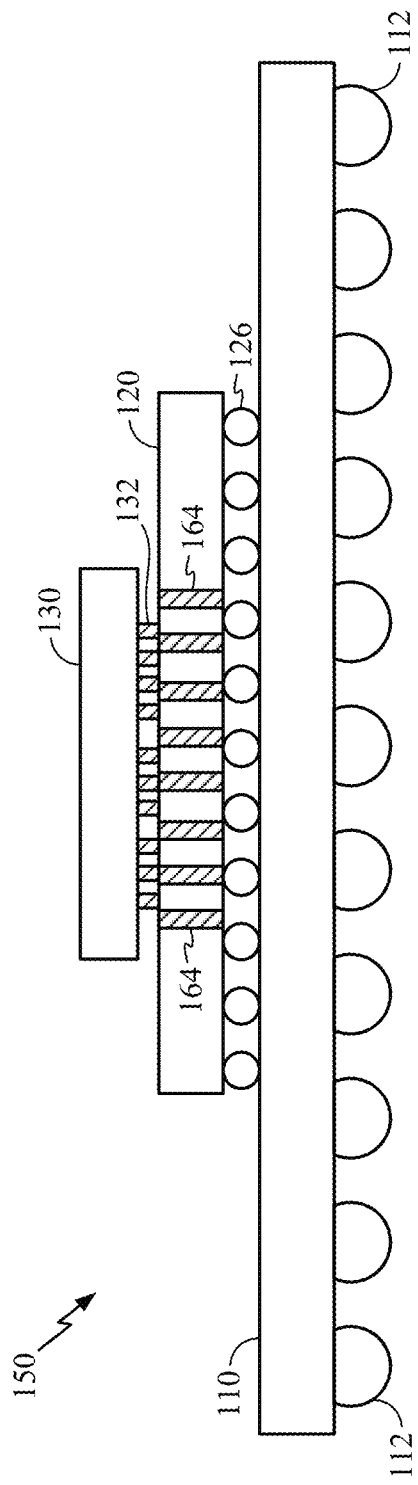
FIG. 1B is a cross-sectional view of a conventional stacked IC having microbump interconnects.

According to another configuration, microbumps may be used in place of the wire bonds 122 between the first die 120 and the packaging substrate 110. FIG. 1B is a cross-sectional view of a conventional stacked IC having microbump interconnects. The second die 130 is stacked on the first die 120 and coupled to the first die 120 with microbumps 132. The microbumps 132 are coupled to through silicon vias 164 in the first die 120. An electrical path exists from the second die 130 to the packaging substrate 110 through the microbumps 132, the through silicon vias 164, and a packaging connection 126.

The microbumps 132 allow a reduced size of the stacked IC 150 by eliminating the bond shell. The microbumps 132 occupy little or no die area beyond the size of the second die 130. The microbumps 132 may provide all communication to the second die 130 including, for example, input/output (I/O), power and ground. The microbumps 132 are manufactured by semiconductor processing similar to manufacturing processes for the through silicon vias 164, which results in the microbumps 132 having small sizes and a pitch substantially similar to the through silicon vias 164. Use of microbumps 132 may make manufacture challenging and costly, increase complexity of alignment to the through silicon vias 164, decrease process margins and provide small margins for warpage of surfaces in the stacked IC 150.

A combination of wire bonds and through silicon vias may be utilized for communication in a packaged stacked IC. Combining wire bonds with through silicon vias to form hybrid interconnects incorporates benefits of both interconnect technologies in stacked IC.

Figure 2A:
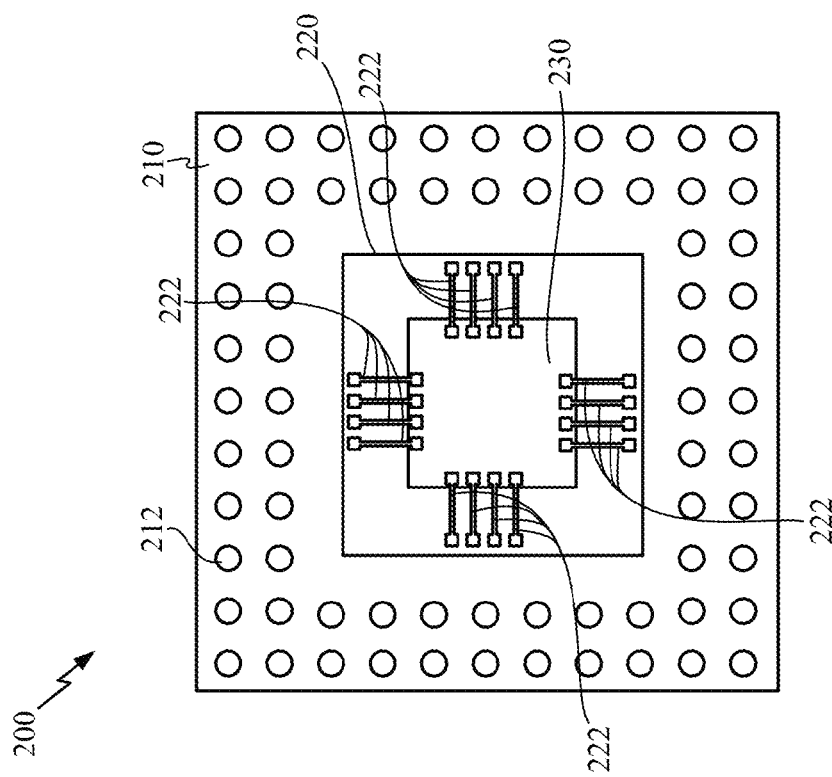
FIG. 2A is a top-down view of an exemplary stacked IC having hybrid wire bond and through silicon via interconnects according to a first embodiment.

FIG. 2A is a top-down view of an exemplary stacked IC having hybrid wire bond and through silicon via interconnects according to a first embodiment. A stacked IC 200 includes a packaging substrate 210 having a packaging connection 212 such as bumps of a ball grid array (BGA). A first die 220 is stacked on the packaging substrate 210. A second die 230 is stacked on the first die 220. Wire bonds 222 couple the second die 230 to the first die 220. A redistribution layer (not yet shown) on the first die 220 couples the wire bonds 222 to through silicon vias (not yet shown) in the first die 220. Through silicon vias allow communication between the second die 230 and the packaging substrate 210.

Additional dies may be stacked on the second die 230 or stacked on the first die 220 proximal to the second die 230. In either arrangement, the additional dies may have additional wire bonds that couple the additional dies to the first die 220. If additional dies are stacked on the second die 230, wire bonds may couple the additional dies to the wire bonds 222 on the second die 230. For example, wire bonds may couple the additional dies to a redistribution layer on the second die 230.

Figure 2B:
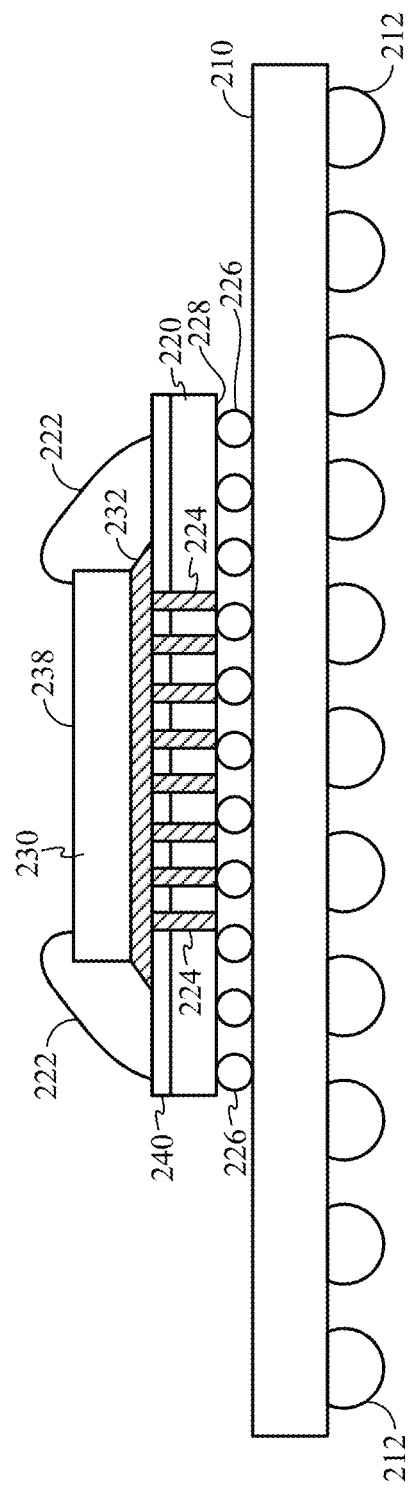
FIG. 2B is a cross-sectional view of an exemplary stacked IC having hybrid wire bond and through silicon via interconnects according to the first embodiment.

FIG. 2B is a cross-sectional view of an exemplary stacked IC having hybrid wire bond and through silicon via interconnects according to the first embodiment. The packaging substrate 210 has a packaging connection 212. The first die 220 couples to the packaging substrate 210 through a packaging connection 226 such as a flip chip interconnect. The first die 220 includes an active side 228 containing circuitry facing toward the packaging substrate 210. Through silicon vias 224 in the first die 220 enable communication between a second die 230 and the packaging connection 226. The second die 230 is attached to the first die 220 with a die connect 232.

The wire bonds 222 couple circuitry on an active side 238 of the second die 230 to a redistribution layer (RDL) 240 on the first die 220. The redistribution layer 240 couples the wire bonds 222 to the through silicon vias 224 and the packaging connection 226. The redistribution layer 240 allows manufacturing of the through silicon vias 224 with a coarse pitch based, in part, on design of the redistribution layer 240. That is, layout of the through silicon vias 224 is not limited by the position of the interconnects to the second die 230. In some embodiments, substantially all communication and/or power supply to the second die 230 occurs in the through silicon vias 224. In one embodiment, the through silicon vias 224 may have a coarse pitch and are manufactured with a via last process. An advantage of this configuration is that active sides of the dies 220, 230 are spaced apart from one another. Thus, sensitive circuitry on one die could be insulated from noisy circuitry on the other die.

Figure 2C:
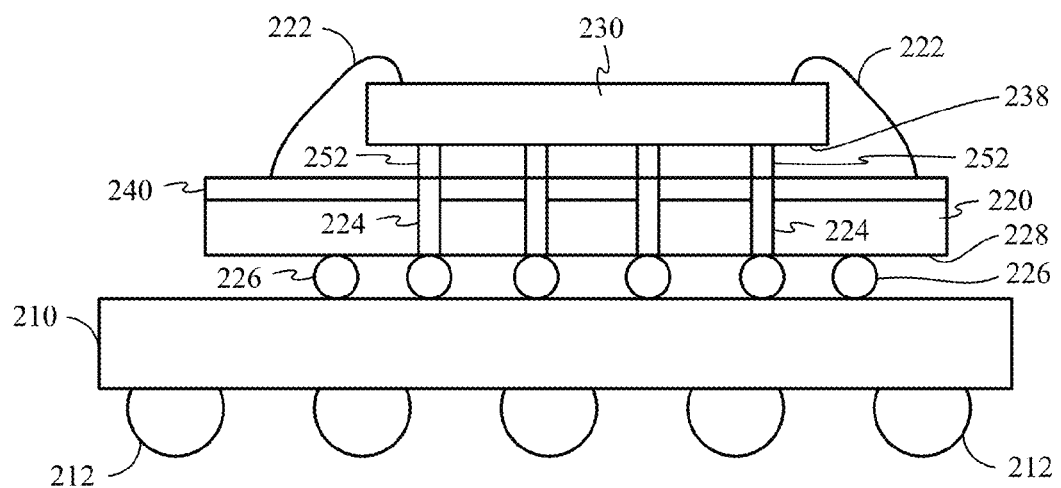
FIG. 2C is a cross-sectional view of an exemplary stacked IC having hybrid wire bond and through silicon via interconnects according to another embodiment.

Another embodiment of hybrid interconnects having wire bonds and through silicon vias is shown in FIG. 2C. The second die 230 may have the active side 238 facing the first die 220. Microbumps 252 may be present between the second die 230 and the first die 220. In one embodiment the second die 230 includes passive components. The passive components may couple to the first die 220 through the microbumps 252 and the wire bonds 222. For example, the second die 230 may have an embedded inductor and/or capacitor. In another example, the second die 230 may have embedded passives that provide a parasitic inductance or capacitance.

Hybrid interconnects having both wire bonds and through silicon vias may increase the amount of space available for routing on the first die 220. In some embodiments where microbumps are not used, process control may be simplified. Further, through silicon via count and cost may be reduced by providing external communication of the second die 230 through the wire bonds 222. The ability to divide the first die 220 or the second die 230 into smaller pieces in product architectures where such a division is advantageous is enabled by flexibility of the hybrid wire bond and through silicon via interconnects. Additionally, separation between active sides on the first die 220 and second die 230 reduces interference that may occur between the dies 220, 230.

Figure 3:
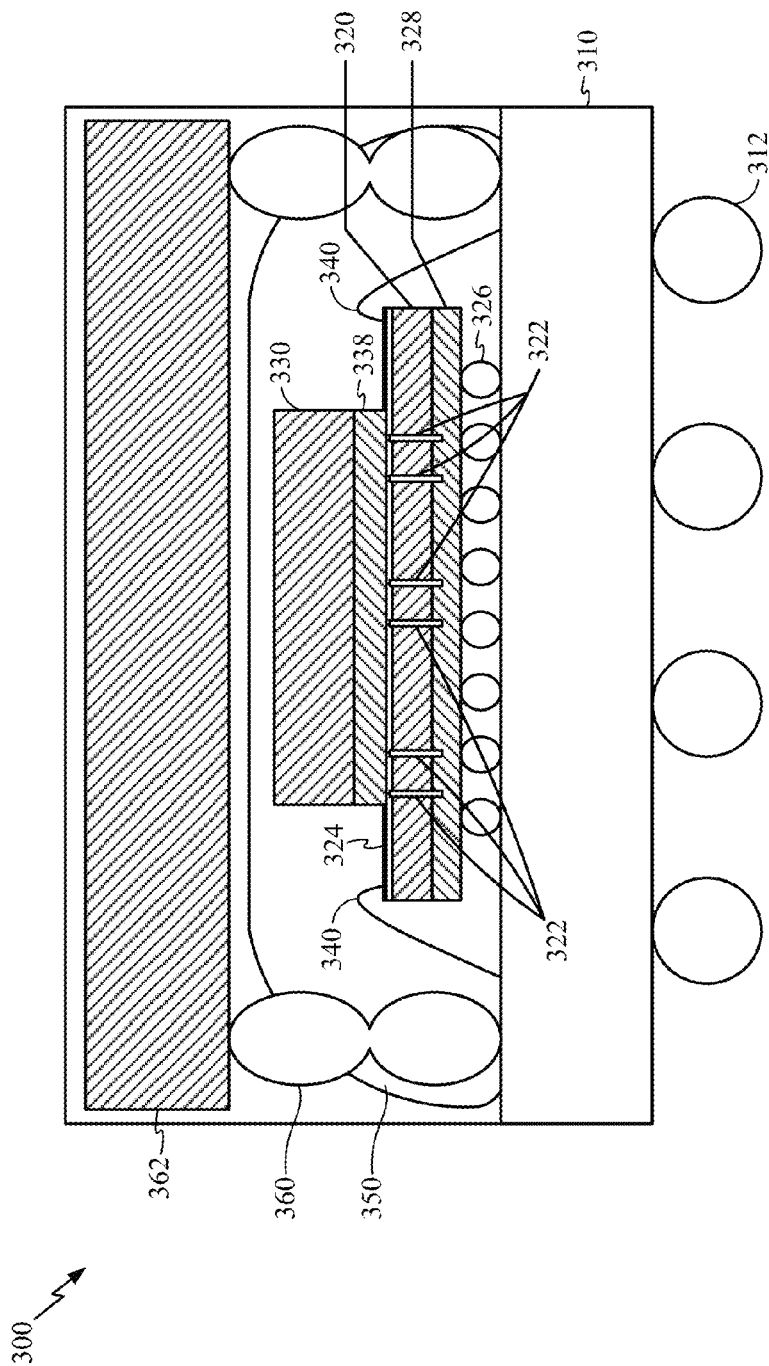
FIG. 3 is a cross-sectional view of an exemplary stacked IC having hybrid wire bond and through silicon via interconnects according to another embodiment.

Power supply and input/output (I/O) communication may be separated by hybrid interconnects with a combination of wire bonds and through silicon vias. Another embodiment of a packaged IC having hybrid wire bond and through silicon via interconnects is illustrated with reference to FIG. 3. FIG. 3 is a cross-sectional view of an exemplary stacked IC having hybrid wire bond and through silicon via interconnects according to another embodiment. A stacked IC 300 includes a packaging substrate 310 having a packaging connection 312 such as bumps of a ball grid array (BGA). A first die 320 is coupled to the packaging substrate 310 through a packaging connection 326 such as a flip chip interconnect. An active side 328 of the first die 320 includes circuitry and faces the packaging substrate 310.

A second die 330 is stacked above the first die 320 and includes circuitry in an active side 338 facing towards the first die 320. The active side 338 is coupled to a redistribution layer (RDL) 324 on the first die 320. A wirebond 340 couples the redistribution layer 324 to the packaging substrate 310 and forms an electrical path between circuitry in the active side 338 and the packaging substrate 310. A bond shell 350 surrounds the first die 320, the second die 330, and the wire bonds 340 and protects the wire bonds 340 during additional assembly processes.

Additionally, through silicon vias 322 in the first die 320 couple the packaging connection 326 to the redistribution layer 324. Thus, circuitry in the active side 338 of the second die 330 communicates with the packaging substrate 310 through both the wire bonds 340 and the through silicon vias 322. According to one embodiment, the wire bonds 340 provide power supply and/or ground rails to the second die 330. In this embodiment, input/output (I/O) communication is provided with the through silicon vias 322. Providing a power supply through the wire bonds 340 reduces the number of through silicon vias 322 in the first die 320 and increases flexibility of design of the first die 320. Thus, manufacturing cost of the stacked IC 300 may be reduced.

In one embodiment, passive devices such as capacitors and/or inductors (not shown) may be coupled to the redistribution layer 324 to provide regulated power to the second die 330. For example, decoupling capacitors may be mounted on the first die 320 proximate to the second die 330 and coupled to the redistribution layer 324. Locating passive devices close to the second die 330 improves dynamic response of the passive devices and reduce manufacturing cost by reducing a number of off-chip components.

In one embodiment, a semiconductor package 362 may be stacked on the packaging substrate 310 with pillars 360. The semiconductor package 362 and the packaging substrate 310 make up, in part, a package-on-package system. For example, in a package-on-package system the first die 320 may be a processor, the second die 330 may be a modem, and the semiconductor package 362 may be a memory device. The depicted package-on-package configuration, however, is not required.

Figure 4:
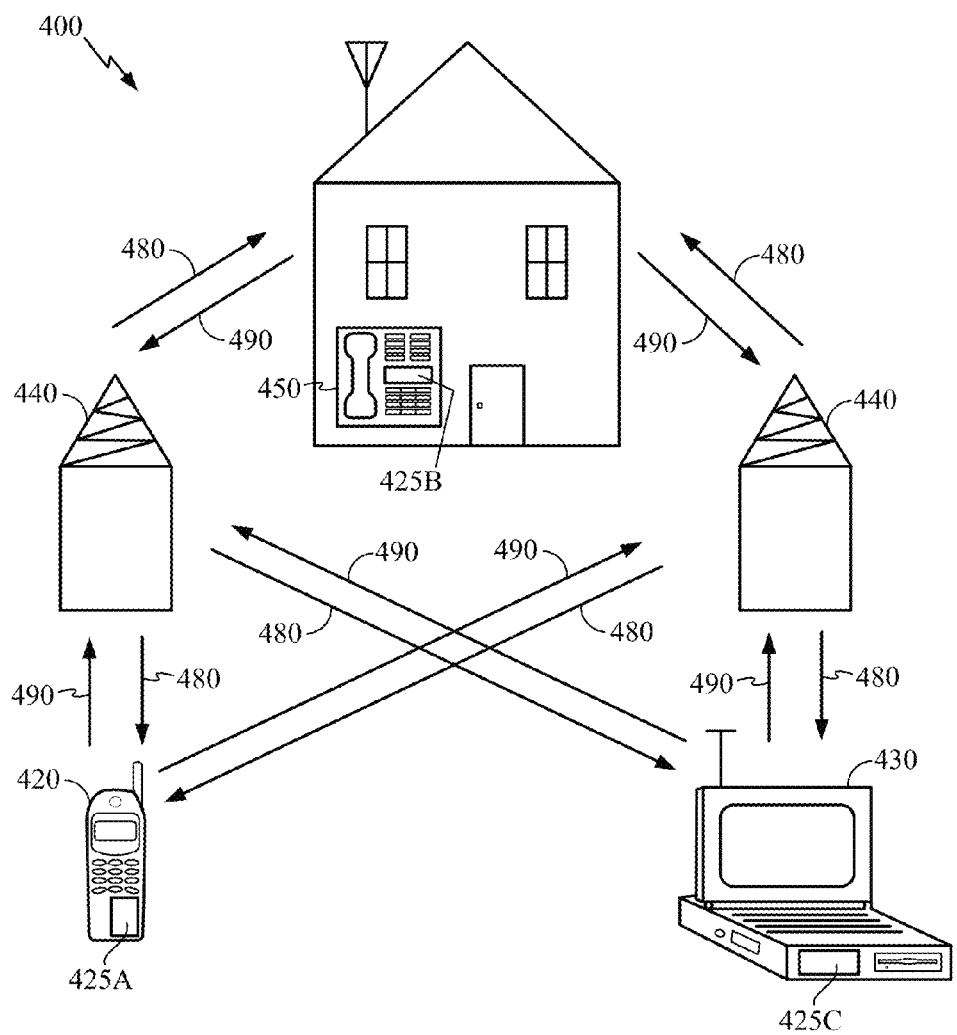
FIG. 4 is a block diagram showing an exemplary wireless communication system in which an embodiment of the disclosure may be advantageously employed.

A packaged IC as shown above may be implemented in a wireless communication system. FIG. 4 shows an exemplary wireless communication system 400 in which an embodiment of the disclosure may be advantageously employed. For purposes of illustration, FIG. 4 shows three remote units 420, 430, and 450 and two base stations 440. It will be recognized that wireless communication systems may have many more remote units and base stations. Remote units 420, 430, and 450 include improved packaged ICs 425A, 425B, and 425C, respectively, which are embodiments as discussed further below. FIG. 4 shows forward link signals 480 from the base stations 440 and the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a computer in a wireless local loop system. For example, the remote units may be cell phones, hand-held personal communication systems (PCS) units, portable data units such as personal data assistants, or fixed location data units such as meter reading equipment. Although FIG. 4 illustrates remote units according to the teachings of the disclosure, the disclosure is not limited to these exemplary illustrated units. The disclosure may be suitably employed in any device which includes packaged ICs.

Figure 5:
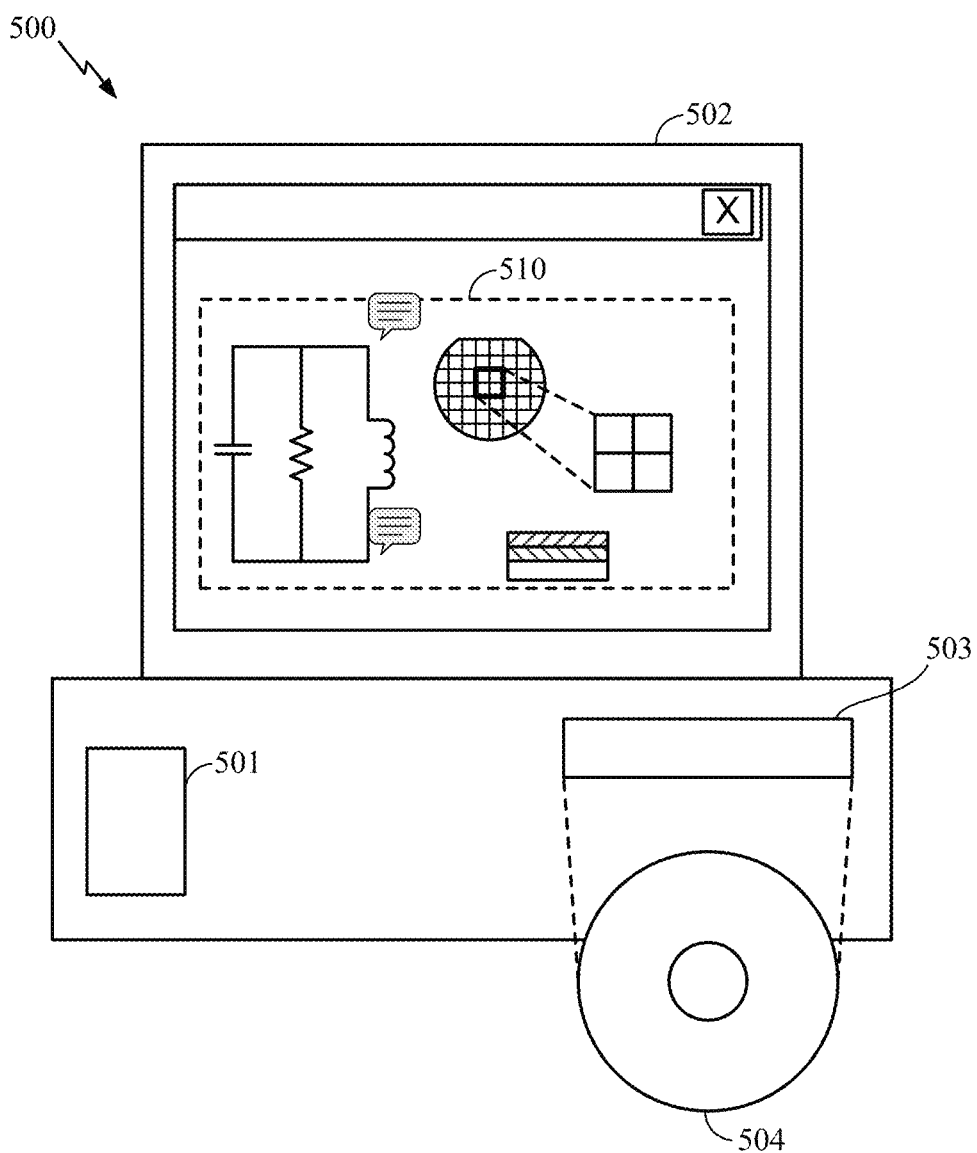
FIG. 5 is a block diagram illustrating a design workstation used for circuit, layout, logic, wafer, die, and layer design of a semiconductor part.

FIG. 5 is a block diagram illustrating a design workstation used for circuit, layout, logic, wafer, die, and layer design of a semiconductor part. A design workstation 500 includes a hard disk 501 containing operating system software, support files, and design software such as Cadence or OrCAD. The design workstation 500 also includes a display to facilitate manufacturing of a semiconductor part 510 that may include a packaged IC. A storage medium 504 is provided for tangibly storing the design of the semiconductor part 510. The design of the semiconductor part 510 may be stored on the storage medium 504 in a file format such as GDSII or GERBER. The storage medium 504 may be a CD-ROM, DVD, hard disk, flash memory, or other appropriate device. Furthermore, the design workstation 500 includes a drive apparatus 503 for accepting input from or writing output to the storage medium 504.

Data recorded on the storage medium 504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 504 facilitates the design of the semiconductor part 510 by decreasing the number of processes for manufacturing circuits, semiconductor wafers, semiconductor dies, or layers contained within a packaged IC.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor system, comprising:
   a first tier die having a redistribution layer and an active side including active circuitry;
   a plurality of through substrate vias extending entirely through the first tier die and coupled to the redistribution layer;
   a second tier die mounted on the first tier die, the second tier die being adjacent to the redistribution layer; and
   a plurality of wire bonds coupling the second tier die and the redistribution layer.

2. The semiconductor system of claim 1, in which the active side of the first tier die faces the second tier die.

3. The semiconductor system of claim 2, further comprising microbumps coupling the first tier die to the second tier die.

4. The semiconductor system of claim 3, further comprising passive devices embedded in the second tier die.

5. The semiconductor system of claim 1, further comprising a third tier die mounted on the second tier die.

6. The semiconductor system of claim 1, further comprising at least one additional second tier die mounted on the first tier die.

7. The semiconductor system of claim 1, in which the semiconductor system is integrated into a cell phone, a hand-held personal communication systems (PCS) unit, a portable data unit, and/or a fixed location data unit.

8. A packaged semiconductor system, comprising:
   a first tier die having a redistribution layer and a plurality of through substrate vias;
   a second tier die mounted on the first tier die, the second tier die being adjacent to the redistribution layer;
   a packaging substrate on which the first tier die is mounted; and
   a first plurality of wire bonds coupling the packaging substrate and the redistribution layer of the first tier die, a second plurality of wire bonds coupling the second tier die to the redistribution layer, the first and the second plurality of wire bonds providing power to the second tier die from the packaging substrate.

9. The packaged semiconductor system of claim 8, further comprising a capacitor coupled to the redistribution layer on the first tier die, the capacitor providing substantially instantaneous current to the second tier die.

10. The packaged semiconductor system of claim 8, in which the redistribution layer is a backside redistribution layer.

11. The packaged semiconductor system of claim 8, further comprising a second packaged semiconductor system mounted on the packaged semiconductor system.

12. The packaged semiconductor system of claim 8, in which the packaged semiconductor system is integrated into a cell phone, a hand-held personal communication systems (PCS) unit, a portable data unit, and/or a fixed location data unit.

13. A method of providing power to a stacked IC semiconductor system having a first tier die with a redistribution layer, an active side including active circuitry and a plurality of through silicon vias extending entirely through the first tier die and coupled to the redistribution layer, the first tier die mounted on a packaging substrate, and the semiconductor system further including a second tier die mounted on the first tier die, the second tier die being adjacent to the redistribution layer, the method comprising: coupling at least one wire bond to the packaging substrate and the redistribution layer; coupling a plurality of wire bonds to the second tier die and the redistribution layer; providing a power supply to the second tier die through the at least one wire bond; and providing communication to the second tier die through at least one of the plurality of through silicon vias.

14. The method of claim 13, further comprising providing a ground rail to the second tier die through the redistribution layer.

15. The method of claim 13, further comprising coupling a capacitor to the redistribution layer of the first tier die.

16. The method of claim 13, further comprising integrating the stacked IC into at least one of a cell phone, a hand-held personal communication systems (PCS) unit, a portable data unit, and a fixed location data unit.

17. A semiconductor system, comprising:
   a first tier die having a means for redistributing power and an active side including active circuitry;
   a plurality of through substrate vias being coupled to the power redistributing means and extending entirely through the first tier die;
   a second tier die mounted on the first tier, the second tier die being adjacent to the power redistributing means; and
   a plurality of wire bonds coupling the second tier die and the power redistributing means.

18. A packaged semiconductor system, comprising:
   a first tier die having means for redistributing power and a plurality of through substrate vias;
   a second tier die mounted on the first tier die, the second tier die being adjacent to the power redistributing means;
   a packaging substrate on which the first tier die is mounted; and
   first plurality of wire bonds coupling the packaging substrate and the power redistributing means of the first tier die, a second plurality of wire bonds coupling the second tier die to the power redistributing means, the first and second plurality of wire bonds providing power to the second tier die from the packaging substrate.

19. The packaged semiconductor system of claim 18, integrated into a cell phone, a hand-held personal communication systems (PCS) unit, a portable data unit, and/or a fixed location data unit.

20. The semiconductor system of claim 17, integrated into a cell phone, a hand-held personal communication systems (PCS) unit, a portable data unit, and/or a fixed location data unit.

* * * * *